United States Patent
Zhang et al.

(10) Patent No.: US 12,482,653 B2
(45) Date of Patent: Nov. 25, 2025

(54) EPITAXIAL STRUCTURE OF SEMICONDUCTOR DEVICE AND METHOD OF MANUFACTURING THE SAME

(71) Applicant: DYNAX SEMICONDUCTOR, INC., Kunshan (CN)

(72) Inventors: Hui Zhang, Kunshan (CN); Shiqiang Li, Kunshan (CN); Naiqian Zhang, Kunshan (CN); Yi Pei, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 363 days.

(21) Appl. No.: 17/921,869

(22) PCT Filed: Jun. 9, 2021

(86) PCT No.: PCT/CN2021/099163
§ 371 (c)(1),
(2) Date: Oct. 27, 2022

(87) PCT Pub. No.: WO2022/068256
PCT Pub. Date: Apr. 7, 2022

(65) Prior Publication Data
US 2023/0170214 A1    Jun. 1, 2023

(30) Foreign Application Priority Data

Sep. 30, 2020 (CN) .......................... 202011065977.3
Sep. 30, 2020 (CN) .......................... 202022206942.9

(51) Int. Cl.
*H01L 21/02*    (2006.01)
*C30B 25/18*    (2006.01)
(Continued)

(52) U.S. Cl.
CPC ...... *H01L 21/02458* (2013.01); *C30B 25/183* (2013.01); *H01L 21/02436* (2013.01);
(Continued)

(58) Field of Classification Search
None
See application file for complete search history.

(56) References Cited

U.S. PATENT DOCUMENTS 9,419,125 B1 *  8/2016  Schultz ............... H10D 62/854
9,608,075 B1 *  3/2017  Wan .................. H01L 21/02381
(Continued)

FOREIGN PATENT DOCUMENTS

CN    101009326 A  *  8/2007
CN    101140947 A  *  3/2008
(Continued)

OTHER PUBLICATIONS

Google Translation of RU169283U1, Mar. 2017 (Year: 2017).*
(Continued)

*Primary Examiner* — Jeffrey A Vonch
(74) *Attorney, Agent, or Firm* — Armstrong Teasdale LLP

(57) ABSTRACT

Embodiments of the present disclosure provide an epitaxial structure of a semiconductor device and a method of manufacturing the same. The epitaxial structure includes a substrate, and an epitaxial layer located on a side of the substrate, the epitaxial layer including a nucleation layer located on a side of the substrate and a buffer layer located on a side of the nucleation layer away from the substrate, wherein a thickness of the buffer layer is inversely proportional to a thickness of the nucleation layer.

9 Claims, 5 Drawing Sheets

US 12,482,653 B2
Page 2

(51) Int. Cl.
*H10D 30/01* (2025.01)
*H10D 30/47* (2025.01)
*H10D 62/17* (2025.01)
*H10D 62/60* (2025.01)
*H10D 62/815* (2025.01)
*H10D 62/82* (2025.01)
*H10D 62/85* (2025.01)
*B32B 5/14* (2006.01)
*C23C 16/02* (2006.01)
*C23C 16/30* (2006.01)
*C30B 29/40* (2006.01)
*H10D 62/824* (2025.01)
*H10H 20/815* (2025.01)

(52) U.S. Cl.
CPC .. *H01L 21/02502* (2013.01); *H01L 21/02505* (2013.01); *H01L 21/02507* (2013.01); *H01L 21/02518* (2013.01); *H01L 21/0254* (2013.01); *H01L 21/0257* (2013.01); *H01L 21/02576* (2013.01); *H01L 21/02579* (2013.01); *H10D 30/015* (2025.01); *H10D 30/475* (2025.01); *H10D 62/60* (2025.01); *H10D 62/82* (2025.01); *H10D 62/8503* (2025.01); *B32B 5/145* (2013.01); *C23C 16/0272* (2013.01); *C23C 16/029* (2013.01); *C23C 16/303* (2013.01); *C30B 29/403* (2013.01); *C30B 29/406* (2013.01); *H01L 21/0251* (2013.01); *H01L 21/02581* (2013.01); *H01L 2924/10323* (2013.01); *H01L 2924/1033* (2013.01); *H01L 2924/10344* (2013.01); *H10D 62/328* (2025.01); *H10D 62/343* (2025.01); *H10D 62/824* (2025.01); *H10H 20/815* (2025.01); *Y10T 428/24942* (2015.01); *Y10T 428/2495* (2015.01)

(56) References Cited

U.S. PATENT DOCUMENTS

| | | | | |
|---|---|---|---|---|
| 9,728,610 B1* | 8/2017 | Wan | | H10F 71/1278 |
| 9,917,156 B1* | 3/2018 | Laboutin | | H01L 21/0262 |
| 2002/0036287 A1* | 3/2002 | Yu | | H10D 30/051 |
| | | | | 257/E21.407 |
| 2004/0074437 A1* | 4/2004 | Fang | | C30B 29/403 |
| | | | | 117/2 |
| 2004/0238842 A1* | 12/2004 | Micovic | | H10D 30/015 |
| | | | | 257/E29.253 |
| 2005/0106849 A1* | 5/2005 | Gwo | | H01L 21/02488 |
| | | | | 438/602 |
| 2006/0102926 A1* | 5/2006 | Kikkawa | | H10D 30/4755 |
| | | | | 257/E29.253 |
| 2006/0154455 A1* | 7/2006 | Guo | | H01L 21/02491 |
| | | | | 257/E21.127 |
| 2010/0123169 A1* | 5/2010 | Sato | | H10D 30/4732 |
| | | | | 257/E29.089 |
| 2010/0244098 A1* | 9/2010 | Yokoyama | | H01L 21/02458 |
| | | | | 257/E29.246 |
| 2010/0289067 A1* | 11/2010 | Mishra | | H10D 62/854 |
| | | | | 257/268 |
| 2011/0240962 A1* | 10/2011 | Ikuta | | C30B 25/18 |
| | | | | 438/479 |
| 2012/0025202 A1* | 2/2012 | Makabe | | H10D 30/4755 |
| | | | | 257/E29.246 |
| 2012/0025203 A1* | 2/2012 | Nakata | | H10D 62/8503 |
| | | | | 257/E29.089 |
| 2012/0025205 A1* | 2/2012 | Nakata | | H01L 21/02505 |
| | | | | 257/77 |
| 2012/0025206 A1* | 2/2012 | Nakata | | H10D 30/4755 |
| | | | | 257/77 |
| 2012/0091435 A1* | 4/2012 | Ikuta | | H10D 62/357 |
| | | | | 257/E29.024 |
| 2012/0112203 A1* | 5/2012 | Enya | | H01S 5/34333 |
| | | | | 438/46 |
| 2012/0322245 A1* | 12/2012 | Ohno | | H01L 21/02378 |
| | | | | 257/E21.09 |
| 2013/0026480 A1* | 1/2013 | Fenwick | | H10H 20/0133 |
| | | | | 257/E29.089 |
| 2013/0062612 A1* | 3/2013 | Shioda | | H10H 20/815 |
| | | | | 257/E29.089 |
| 2013/0069208 A1* | 3/2013 | Briere | | H10D 62/8171 |
| | | | | 257/E21.09 |
| 2013/0082274 A1* | 4/2013 | Yang | | H01L 21/02458 |
| | | | | 438/47 |
| 2013/0092953 A1 | 4/2013 | Miyoshi et al. | | |
| 2013/0099243 A1* | 4/2013 | Chen | | H10D 30/015 |
| | | | | 257/E29.089 |
| 2013/0200495 A1* | 8/2013 | Keller | | H01L 21/02507 |
| | | | | 257/E29.089 |
| 2013/0270575 A1* | 10/2013 | Humphreys | | H10F 10/17 |
| | | | | 438/478 |
| 2014/0015608 A1* | 1/2014 | Kotani | | H10D 62/357 |
| | | | | 363/16 |
| 2014/0017840 A1* | 1/2014 | Ou | | H01L 21/0254 |
| | | | | 438/46 |
| 2014/0091313 A1* | 4/2014 | Kotani | | H10D 62/60 |
| | | | | 257/76 |
| 2014/0091318 A1* | 4/2014 | Ishiguro | | H01L 21/02581 |
| | | | | 257/76 |
| 2014/0197418 A1* | 7/2014 | Chen | | H10D 62/824 |
| | | | | 438/478 |
| 2014/0239308 A1* | 8/2014 | Hallin | | H10D 30/015 |
| | | | | 438/478 |
| 2014/0264370 A1* | 9/2014 | Keller | | H10D 62/221 |
| | | | | 257/194 |
| 2015/0060765 A1* | 3/2015 | Kotani | | H10D 62/357 |
| | | | | 257/22 |
| 2015/0090957 A1* | 4/2015 | Tomabechi | | H10D 30/4755 |
| | | | | 438/285 |
| 2015/0311290 A1* | 10/2015 | Kang | | H01L 21/02378 |
| | | | | 257/77 |
| 2015/0348780 A1* | 12/2015 | Era | | H10D 30/015 |
| | | | | 438/172 |
| 2015/0349064 A1* | 12/2015 | Azize | | H10D 30/015 |
| | | | | 438/478 |
| 2015/0357419 A1* | 12/2015 | Lutgen | | H10D 62/824 |
| | | | | 257/201 |
| 2016/0071727 A1* | 3/2016 | Yamamoto | | H01L 21/02505 |
| | | | | 438/478 |
| 2016/0126312 A1* | 5/2016 | Moens | | H10D 30/015 |
| | | | | 257/192 |
| 2016/0315179 A1* | 10/2016 | Nishimori | | H10D 62/8503 |
| 2016/0329462 A1* | 11/2016 | Hu | | C30B 29/406 |
| 2016/0359005 A1* | 12/2016 | Hu | | H10D 62/854 |
| 2017/0033209 A1* | 2/2017 | Sato | | H01L 21/02579 |
| 2017/0117404 A1* | 4/2017 | Era | | H10D 62/60 |
| 2017/0133217 A1* | 5/2017 | Sato | | H10D 62/854 |
| 2017/0170283 A1* | 6/2017 | Laboutin | | H01L 21/0257 |
| 2017/0271454 A1* | 9/2017 | Prechtl | | H01L 21/02458 |
| 2017/0278961 A1* | 9/2017 | Hill | | H01L 21/26546 |
| 2017/0373157 A1* | 12/2017 | Kuenle | | H10D 12/01 |
| 2018/0069086 A1* | 3/2018 | Ishiguro | | H10D 30/015 |
| 2018/0197737 A1* | 7/2018 | Kinoshita | | H10D 30/475 |
| 2018/0204908 A1* | 7/2018 | Sato | | H01L 21/0262 |
| 2018/0277363 A1* | 9/2018 | Narukawa | | C23C 16/34 |
| 2019/0006501 A1* | 1/2019 | Yang | | H10D 30/4732 |
| 2019/0006553 A1* | 1/2019 | Jain | | C30B 25/183 |
| 2019/0081165 A1* | 3/2019 | Huang | | H10D 8/60 |
| 2019/0103482 A1* | 4/2019 | Yang | | H10D 30/4732 |
| 2019/0198653 A1* | 6/2019 | Chu | | H10D 62/115 |
| 2019/0279864 A1* | 9/2019 | Narukawa | | H10D 62/8325 |
| 2020/0020778 A1* | 1/2020 | Narukawa | | H01L 21/02458 |
| 2020/0203521 A1* | 6/2020 | Kordina | | H01L 21/02505 |
| 2021/0125825 A1* | 4/2021 | Cheng | | H01L 21/0254 |
| 2021/0193794 A1* | 6/2021 | Cheng | | H10D 62/854 |

(56) References Cited

U.S. PATENT DOCUMENTS

| | | | | |
|---|---|---|---|---|
| 2021/0257214 A1* | 8/2021 | Cheng | ................. | H10D 62/824 |
| 2022/0029007 A1* | 1/2022 | Chen | ................... | H10D 62/824 |

FOREIGN PATENT DOCUMENTS

| | | | | | |
|---|---|---|---|---|---|
| CN | 101266999 | A | * | 9/2008 | |
| CN | 101312207 | A | * | 11/2008 | |
| CN | 101789446 | A | * | 7/2010 | |
| CN | 102427084 | A | * | 4/2012 | |
| CN | 102569390 | A | * | 7/2012 | |
| CN | 102646700 | A | * | 8/2012 | |
| CN | 102842613 | A | * | 12/2012 | |
| CN | 102931230 | A | * | 2/2013 | |
| CN | 103578986 | A | * | 2/2014 | ......... H01L 21/2056 |
| CN | 103579326 | A | * | 2/2014 | ........... H10D 62/357 |
| CN | 103779397 | A | * | 5/2014 | ......... H10D 62/824 |
| CN | 104505400 | A | * | 4/2015 | ............. H10D 30/47 |
| CN | 104576714 | A | * | 4/2015 | ......... H10D 30/015 |
| CN | 104600109 | A | | 5/2015 | |
| CN | 104733510 | A | * | 6/2015 | ............. H10D 30/47 |
| CN | 104992964 | A | * | 10/2015 | ............. H10D 30/00 |
| CN | 105047695 | A | * | 11/2015 | ....... H01L 21/02587 |
| CN | 105932118 | A | * | 9/2016 | ........... C30B 29/406 |
| CN | 106033787 | A | * | 10/2016 | ............. C30B 25/02 |
| CN | 106373884 | A | | 2/2017 | |
| CN | 106435720 | A | * | 2/2017 | ......... H01L 21/0254 |
| CN | 106601787 | A | * | 4/2017 | ......... H10D 30/4755 |
| CN | 106972058 | A | * | 7/2017 | ......... H01L 29/0615 |
| CN | 107546261 | A | * | 1/2018 | |
| CN | 108122966 | A | * | 6/2018 | ............. H10D 30/47 |
| CN | 108172501 | A | * | 6/2018 | ......... H01L 21/0254 |
| CN | 108400165 | A | | 8/2018 | |
| CN | 108550518 | A | * | 9/2018 | ........... C30B 25/025 |
| CN | 109638066 | A | * | 4/2019 | ........... H10D 30/015 |
| CN | 110335894 | A | * | 10/2019 | ............. H10D 30/47 |
| CN | 110429025 | A | * | 11/2019 | ............. C30B 25/18 |
| CN | 110828291 | A | * | 2/2020 | ............. C30B 29/04 |
| CN | 110838514 | A | | 2/2020 | |
| CN | 213212169 | U | | 5/2021 | |
| JP | 2011035065 | A | * | 2/2011 | |
| JP | 2011199222 | A | * | 10/2011 | |
| JP | 2012151234 | A | * | 8/2012 | |
| JP | 2013008836 | A | * | 1/2013 | |
| JP | 2016187024 | A | * | 10/2016 | |
| JP | 2016219690 | A | | 12/2016 | |
| JP | 2018046207 | A | | 3/2018 | |
| JP | 2018198255 | A | * | 12/2018 | |
| RU | 169283 | U1 | * | 3/2017 | |
| WO | WO-2007097264 | A1 | * | 8/2007 | ......... H10D 30/4755 |
| WO | 2011155496 | A1 | | 12/2011 | |
| WO | WO-2018129642 | A1 | * | 7/2018 | ............. H10D 30/47 |

OTHER PUBLICATIONS

Bergsten et al., AlGaN/GaN high electron mobility transistors with intentionally doped GaN buffer using propane as carbon precursor, Mar. 2016, Japanese Journal of Applied Physics, vol. 55, No. 5S, p. 05FK02 (Year: 2016).*
Machine Translation of CN106373884A, Feb. 2017 (Year: 2017).*
Machine Translation of CN106972058A, Jul. 2017 (Year: 2017).*
Machine Translation of CN107546261A, Jan. 2018 (Year: 2018).*
JP First Office Action, Application No. 2023-518044, dated May 20, 2024, 12 pps.: with English translation.
PCT International Search Report and Written Opinion, Application No. PCT/CN2021/099163, dated Sep. 10, 2021, 12 pages: with English translation.

* cited by examiner

EPITAXIAL STRUCTURE OF SEMICONDUCTOR DEVICE AND METHOD OF MANUFACTURING THE SAME

CROSS REFERENCE TO RELATED APPLICATIONS

This patent application is a National Stage Entry of PCT/CN2021/099163 filed on Jun. 9, 2021, which claims the benefit and priority of Chinese Patent Application No. 202022206942.9 filed on Sep. 30, 2020, and Chinese Patent Application No. 202011065977.3 filed on Sep. 30, 2020, the disclosures of which are incorporated by reference herein in their entirety as part of the present application.

BACKGROUND

Embodiments of the present disclosure relate to the field of semiconductor technology, and particularly, to an epitaxial structure of a semiconductor device, a method of manufacturing the same, and a semiconductor device.

The semiconductor material gallium nitride (GaN) is more suitable for manufacturing high-frequency, high-voltage and high-temperature resistant high-power electronic devices than first-generation semiconductor materials and second-generation semiconductor materials because of its wide band gap, high electron mobility, high breakdown field strength, good thermal conductivity, etc., and strong spontaneous and piezoelectric polarization effects, especially in the field of radio frequency and power supply.

At present, in the manufacture of GaN-based optoelectronic devices and power devices, there are thermal mismatches and lattice mismatches between the GaN epitaxial layer and the substrate, and the thermal mismatch stress and lattice mismatch strain caused in the epitaxial growth process will cause deformation of the epitaxial wafer, thereby reducing the uniformity of the epitaxial layer, decreasing the yield of epitaxial products, and increasing the cost. Therefore, a nucleation layer is introduced between the GaN epitaxial layer and the base.

However, the existence of the nucleation layer will increase the overall thermal resistance of the epitaxial layer. Therefore, in order to alleviate this problem, most of the industry uses a thin nucleation layer, while the thin nucleation layer has a problem of poor crystal quality, and the poor crystal quality will affect the crystal quality of the subsequently grown GaN, thereby affecting the reliability of the final device. At present, the manufacture of third-generation semiconductor devices with superior electrical performance and stable reliability is inseparable from semiconductor epitaxial structures with good crystal quality, good uniformity and low industrial cost as the basis to match the performance of semiconductor devices.

Therefore, how to obtain an epitaxial structure with good crystal quality and low cost without increasing the thermal resistance has become an urgent problem to be solved at present.

In addition, due to the strong two-dimensional electron gas in the AlGaN/GaN heterostructure, High Electron Mobility Transistor (HEMT) formed by AlGaN/GaN heterojunction is usually used as depletion mode device. In order to obtain higher breakdown voltage, better switching characteristics and more reliable performance of the device, a high resistance GaN buffer layer must be obtained at first.

There are many methods to obtain a high resistance GaN buffer layer, and the commonly used method is to perform C doping or Fe doping. However, the C content required to obtain a sufficiently high resistance GaN buffer layer results in poor crystal quality, thereby affecting the reliability of the final device, and the deep energy level trap formed by C dopants easily degrades performances such as output power of the final device, and the Fe content required to obtain a sufficiently high resistance GaN buffer layer results in poor surface and crystal quality of the epitaxial layer, and also affects the performance of the final device. Therefore, how to ensure the performance of the final device while ensuring the crystal quality of the epitaxial layer has become an urgent problem to be solved at present.

BRIEF DESCRIPTION

On that account, embodiments of the present disclosure provide an epitaxial structure of a semiconductor device, a method of manufacturing the same, and a semiconductor device, to provide an epitaxial structure with good thermal resistance of the nucleation layer and good crystal quality, and further to provide an epitaxial structure with good high resistance characteristics of the buffer layer and good crystal quality.

In a first aspect, an embodiment of the present disclosure provides an epitaxial structure of a semiconductor device, including a substrate, and an epitaxial layer located on a side of the substrate, the epitaxial layer including a nucleation layer located on a side of the substrate and a buffer layer located on a side of the nucleation layer away from the substrate, wherein a thickness of the buffer layer is inversely proportional to a thickness of the nucleation layer.

Optionally, the thickness of the nucleation layer is $h1$, and the thickness of the buffer layer is $h2$,
where $0.1/h2 \leq h1 \leq 0.25/h2$.

Optionally, $h1 = 0.17/h2$.

Optionally, the thickness of the nucleation layer is $h1$, and a thickness of the substrate is $h3$,
where $2*10^{-5} \leq h1/h3 \leq 5*10^{-4}$.

Optionally, the thickness of the nucleation layer is $h1$, and a thickness of the epitaxial layer is $h4$,
where $0.05 \leq h1/h4 \leq 0.3$.

Optionally, $0.07 \leq h1/h4 \leq 0.1$.

Optionally, the thickness of the nucleation layer is $h1$, where $100 \text{ nm} \leq h1 \leq 150 \text{ nm}$.

Optionally, the epitaxial layer further includes a spacer layer located on a side of the buffer layer away from the substrate, a barrier layer located on a side of the spacer layer away from a baseboard of the substrate, the barrier layer and the buffer layer forming a heterojunction structure, and a capping layer located on a side of the barrier layer away from the substrate.

Optionally, the buffer layer includes a first-type buffer layer and a second-type buffer layer arranged in layers, the first-type buffer layer is located on a side close to the substrate, and a doping concentration of the first-type buffer layer is greater than a doping concentration of the second-type buffer layer.

Optionally, the first-type buffer layer includes at least one first buffer layer, and the second-type buffer layer includes at least one second buffer layer, and a doping concentration of the first buffer layer is greater than a doping concentration of the second buffer layer.

Optionally, the first-type buffer layer includes a first A buffer layer and a first B buffer layer arranged in layers, the first A buffer layer is located on a side close to the substrate, and a doping concentration of the first A buffer layer is greater than or equal to a doping concentration of the first B buffer layer, and the second-type buffer layer includes a second A buffer layer and a second B buffer layer arranged in layers, the second A buffer layer is located on a side close to the substrate, and a doping concentration of the second A buffer layer is greater than a doping concentration of the second B buffer layer.

Optionally, the first A buffer layer, the first B buffer layer, the second A buffer layer, and the second B buffer layer are all doped with carbon ions, and a doping concentration of carbon ions in the first A buffer layer is a first doping concentration C1, a doping concentration of carbon ions in the first B buffer layer is a second doping concentration C2, a doping concentration of carbon ions in the second A buffer layer is a third doping concentration C3, and a doping concentration of carbon ions in the second B buffer layer is a fourth doping concentration C4, where C1>C2≥C3>C4.

Optionally, the first A buffer layer and the first B buffer layer are further doped with iron ions, while the second A buffer layer and the second B buffer layer are not doped with iron ions, and a doping concentration of iron ions in the first A buffer layer is a fifth doping concentration, and a doping concentration of iron ions in the first B buffer layer is a sixth doping concentration, where the fifth doping concentration is the same as the sixth doping concentration.

Optionally, the doping concentration of carbon ions in the first A buffer layer is the first doping concentration C1, and the fifth doping concentration is C5, where C1/C5= (0.5~1.2)/10;

the doping concentration of carbon ions in the first B buffer layer is the second doping concentration C2, and the sixth doping concentration is C6, where C2/C6= (0.1~0.3)/10;

the doping concentration of carbon ions in the second A buffer layer is the third doping concentration C3, where C3=C2; and the doping concentration of carbon ions in the second B buffer layer is the fourth doping concentration C4, where C4/C3=(1~2)/10.

Optionally, a thickness of the first buffer layer is greater than a thickness of the second buffer layer.

Optionally, the first-type buffer layer includes a first A buffer layer and a first B buffer layer arranged in layers, the first A buffer layer is located on a side close to the substrate, and a thickness of the first A buffer layer is greater than or equal to a thickness of the first B buffer layer, and the second-type buffer layer includes a second A buffer layer and a second B buffer layer arranged in layers, the second A buffer layer is located on a side close to the substrate, and a thickness of the second A buffer layer is greater than a thickness of the second B buffer layer.

Optionally, the thickness of the first A buffer layer is h1, the thickness of the first B buffer layer is h2, the thickness of the second A buffer layer is h3, and the thickness of the second B buffer layer is h4;

where h2=h1, 2/10≤h3/h2≤9/10, 4/10≤h4/h3≤9/10.

In a second aspect, an embodiment of the present disclosure further provides a semiconductor device, including the epitaxial structure according to the first aspect, the epitaxial structure including a substrate and a nucleation layer, a buffer layer, a spacer layer, a barrier layer, and a capping layer sequentially located on a side of the substrate, the semiconductor device further including a source and a drain located on a side of the barrier layer away from the substrate, and a gate located on a side of the capping layer away from the substrate, the gate being located between the source and the drain.

In a third aspect, an embodiment of the present disclosure further provides a method of manufacturing an epitaxial structure of a semiconductor device, including providing a substrate, forming a nucleation layer on a side of the substrate, forming a buffer layer on a side of the nucleation layer away from the substrate, forming a spacer layer on a side of the buffer layer away from the substrate, forming a barrier layer on a side of the spacer layer away from the substrate, the barrier layer and the buffer layer forming a heterojunction structure, and forming a capping layer on a side of the barrier layer away from the substrate, wherein a thickness of the buffer layer is inversely proportional to a thickness of the nucleation layer.

In the epitaxial structure of the semiconductor device and the semiconductor device provided by the embodiments of the present disclosure, by setting the thickness of the nucleation layer to be inversely proportional to the thickness of the buffer layer, the crystal quality of the nucleation layer is improved in the case where it is ensured that the thermal resistance of the nucleation layer in the epitaxial structure is not increased, thereby improving the quality of the epitaxial structure and the reliability of the semiconductor device.

Furthermore, in the epitaxial structure of the semiconductor device and the method of manufacturing the same, and the semiconductor device provided by the embodiments of the present disclosure, by setting the buffer layer to include the first-type buffer layer and the second-type buffer layer arranged in layers, while setting the doping concentration of the first-type buffer layer to be greater than the doping concentration of the second-type buffer layer, while ensuring the high resistance characteristic of the buffer layer in the epitaxial structure, it may ensure that the crystal quality of the buffer layer is good, thereby improving the quality of the epitaxial structure as well as the semiconductor device.

DETAILED DESCRIPTION

Figure 1:
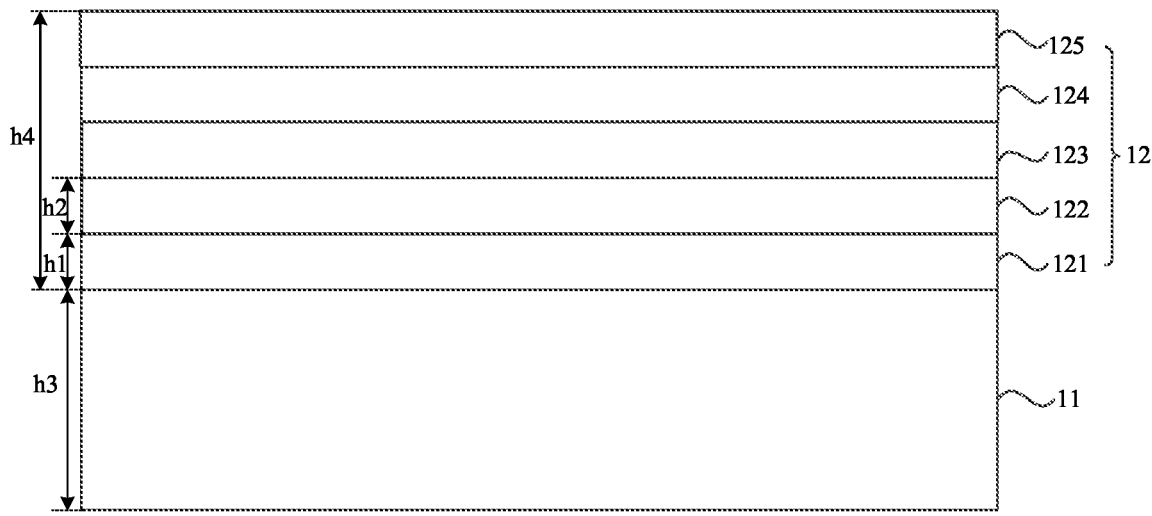
FIG. 1 is a schematic structural diagram of an epitaxial structure of a semiconductor device provided by an embodiment of the present disclosure.

The present disclosure will be further described in detail below in conjunction with the drawings and embodiments. It may be appreciated that the specific embodiments described herein are only intended to explain the present disclosure, other than limiting the present disclosure. Additionally, it should be noted that, for ease of description, only the parts related to the present disclosure, rather than the whole structure, are shown in the drawings.

FIG. 1 is a schematic structural diagram of an epitaxial structure of a semiconductor device provided by an embodiment of the present disclosure. As shown in FIG. 1, the epitaxial structure of the semiconductor device provided by the embodiment of the present disclosure includes a substrate 11 and an epitaxial layer 12 located on a side of the substrate 11. The epitaxial layer 12 includes a nucleation layer 121 on a side of the substrate 11 and a buffer layer 122 on a side of the nucleation layer 12 away from the substrate 11, wherein the thickness of the buffer layer 122 is inversely proportional to the thickness of the nucleation layer 121.

Exemplarily, the substrate 11 may be one or a combination of gallium nitride, aluminum gallium nitride, indium gallium nitride, aluminum indium gallium nitride, indium phosphide, gallium arsenide, silicon carbide, diamond, sapphire, germanium, and silicon, or any other material capable of growing Group III nitrides, and the specific type of the substrate 11 will not be limited in the embodiment of the present disclosure.

The epitaxial layer 12 is located on a side of the substrate 11, and the epitaxial layer 12 may specifically include a semiconductor material based on group III-V compounds.

Specifically, the epitaxial layer 12 includes a nucleation layer 121 on a side close to the substrate 11 and a buffer layer 122 on a side of the nucleation layer 121 away from the substrate 11, wherein the nucleation layer 121 affects parameters such as crystal quality, surface morphology, and electrical properties of other film layers located above the nucleation layer 121 in the epitaxial layer 12. The nucleation layer 121 mainly plays a role of matching the material of the substrate 11 and the semiconductor material layer in the heterojunction structure in the epitaxial layer 12. The buffer layer 122 plays a role of bonding the semiconductor material layers to be grown next.

Further, the material of the nucleation layer 121 may be aluminum nitride, and the material of the buffer layer 122 may be gallium nitride.

Since the existence of the AlN nucleation layer will increase the overall thermal resistance of the epitaxial layer 12, in order to alleviate this problem, most of the industry uses thin AlN as the AlN nucleation layer, however, it is very difficult to obtain good crystal quality for a thin AlN nucleation layer. Increasing the thickness of the AlN nucleation layer is one of the ways to improve the crystal quality, but simply increasing the thickness of the AlN will lead to an increase in thermal resistance and affect device performance. The embodiment of the present disclosure creatively sets the thickness of the nucleation layer 121 in the epitaxial layer 12 to be inversely proportional to the thickness of the buffer layer 122, that is, when the thickness of the nucleation layer 121 is increased, the thickness of the buffer layer 122 needs to be decreased at the same time, and when the thickness of the nucleation layer 121 is decreased, the thickness of the buffer layer 122 needs to be increased. After a lot of verification, when the thickness of the nucleation layer 121 in the epitaxial layer 12 is inversely proportional to the thickness of the buffer layer 122, the crystal quality of the nucleation layer 121 may be improved without increasing the thermal resistance, which ensures that the crystal quality, surface morphology and electrical properties of other epitaxial layers above the nucleation layer 121 are good, and ensures that the overall quality and reliability of the epitaxial structure as well as the semiconductor device are good.

In conclusion, in the epitaxial structure of the semiconductor device provided by the embodiment of the present disclosure, by setting the thickness of the nucleation layer to be inversely proportional to the thickness of the buffer layer, the crystal quality of the nucleation layer is improved without increasing the thermal resistance of the nucleation layer in the epitaxial structure, thereby improving the quality of the epitaxial structure as well as the semiconductor device.

On the basis of the embodiment above, the thickness of the nucleation layer 121 is h1, and the thickness of the buffer layer 122 is h2, where $0.1/h2 \leq h1 \leq 0.25/h2$.

Exemplarily, the thickness of the nucleation layer 121 in the epitaxial layer 12 is inversely proportional to the thickness of the buffer layer 122, where the thickness h1 of the nucleation layer 121 and the thickness h2 of the buffer layer 122 may be set to satisfy $0.1/h2 \leq h1 \leq 0.25/h2$; when the thickness h1 of the nucleation layer 121 and the thickness h2 of the buffer layer 122 satisfy the proportional relationship above, the crystal quality of the nucleation layer 121 may be improved without increasing the thermal resistance of the nucleation layer 121, ensuring high reliability of the epitaxial structure as well as the semiconductor device.

Specifically, the thickness h1 of the nucleation layer 121 and the thickness h2 of the buffer layer 122 satisfy $0.1/h2 \leq h1 \leq 0.25/h2$, where it may be $h1=0.1/h2$, or $h1=0.15/h2$, or $h1=0.17/h2$, or $h1=0.2/h2$, or $h1=0.25/h2$, and the specific proportional relationship between the thickness h1 of the nucleation layer 121 and the thickness h2 of the buffer layer 122 will not be limited in the embodiment of the present disclosure, as long as it is ensured that the thickness h1 of the nucleation layer 121 and the thickness h2 of the buffer layer 122 satisfy $0.1/h2 \leq h1 \leq 0.25/h2$; in this way, it is ensured the crystal quality of the nucleation layer 121 is improved without increasing the thermal resistance of the nucleation layer 121, ensuring high reliability of the epitaxial structure as well as the semiconductor device.

On the basis of the embodiment above, the thickness h1 of the nucleation layer 121 and the thickness h2 of the buffer layer 122 may satisfy $h1=0.17/h2$; in this way, it is ensured that the thermal resistance and the crystal quality of the nucleation layer 121 are in an optimal balance, ensured that the crystal quality of the nucleation layer 121 is optimal without increasing the thermal resistance of the nucleation layer 121, or ensured that the thermal resistance is minimal in the case where the crystal quality of the nucleation layer 121 is good, and ensured that the quality of the nucleation layer 121 is optimal, thereby ensuring that the overall reliability of the epitaxial structure as well as the semiconductor device is optimal.

Optionally, the thickness of the nucleation layer 121 is h1, and a thickness of the substrate is h3, where $2*10^{-5} \leq h1/h3 \leq 5*10^{-4}$.

Exemplarily, by reasonably setting the thickness h1 of the nucleation layer 121 and the thickness h3 of the substrate 11 to satisfy $2*10^{-5} \leq h1/h3 \leq 5*10^{-4}$, in the case where it is ensured that the thermal resistance and crystal quality of the nucleation layer 121 are both good, it is ensured that the nucleation layer 121 may sufficiently match the substrate 11, thereby further improving the reliability of the epitaxial structure as well as the semiconductor device.

Specifically, the thickness h1 of the nucleation layer 121 and the thickness h3 of the substrate 11 satisfy $2*10{-5} \leq h1/h3 \leq 5*10^{-4}$, where it may be $h1/h3=2*10^{-5}$, or $h1/h3=5*10^{-5}$, or $h1/h3=1*10^{-4}$, or $h1/h3=3*10^{-4}$, or $h1/h3=5*10^{-4}$, and the specific proportional relationship between the thickness h1 of the nucleation layer 121 and the thickness h3 of the substrate 11 will not be limited in the embodiment of the present disclosure, as long as it is ensured that the thickness h1 of the nucleation layer 121 and the thickness h3 of the substrate 11 satisfy $2*10^{-5} \leq h1/h3 \leq 5*10^{-4}$.

Optionally, the thickness of the nucleation layer 121 is h1, and a thickness of the epitaxial layer 12 is h4, where $0.05 \leq h1/h4 \leq 0.3$.

Exemplarily, by reasonably setting the thickness h1 of the nucleation layer 121 and the thickness h4 of the epitaxial layer 12 to satisfy $0.05 \leq h1/h4 \leq 0.3$, in the case where it is ensured that the thermal resistance and the crystal quality of the nucleation layer 121 are both good, it is ensured that the thickness of the nucleation layer 121 may match the overall thickness of the epitaxial layer 12, ensured that other film layers in the epitaxial layer 12 except the nucleation layer 121 have a suitable thickness range, and ensured that the overall quality of the epitaxial layer 12 is good, and the reliability of the epitaxial structure as well as the semiconductor device is high.

Specifically, the thickness h1 of the nucleation layer 121 and the thickness h4 of the epitaxial layer 12 satisfy $0.05 \leq h1/h4 \leq 0.3$, where it may be h1/h4=0.05, or h1/h4=0.1, or h1/h4=0.2, or h1/h4=0.3, and the specific proportional relationship between the thickness h1 of the nucleation layer 121 and the thickness h4 of the epitaxial layer 12 will not be limited in the embodiment of the present disclosure, as long as it is ensured that the thickness h1 of the nucleation layer 121 and the thickness h4 of the epitaxial layer 12 satisfy $0.05 \leq h1/h4 \leq 0.3$.

On the basis of the embodiment above, the thickness h1 of the nucleation layer 121 and the thickness h4 of the epitaxial layer 12 satisfy $0.07 \leq h1/h4 \leq 0.1$; in this way, in the case where it is ensured that the thermal resistance and crystal quality of the nucleation layer 121 are both good, it is ensured that the thickness of the nucleation layer 121 may perfectly match the overall thickness of the epitaxial layer 12, further ensured that other film layers in the epitaxial layer 12 except the nucleation layer 121 have a suitable thickness range, further improving the overall quality of the epitaxial layer 12, and further improving the reliability of epitaxial structure as well as semiconductor device.

Optionally, when the thickness h3 of the substrate is between 400 μm and 600 μm, the thickness of the nucleation layer 121 is h1, where 100 nm ≤ h1 ≤ 150 nm.

Exemplarily, the thickness h1 of the nucleation layer 121 is reasonably set to satisfy 100 nm ≤ h1 ≤ 150 nm, ensuring that the nucleation layer 121 has small thermal resistance and good crystal quality at the same time.

Specifically, the thickness h1 of the nucleation layer 121 satisfies 100 nm ≤ h1 ≤ 150 nm, where it may be h1=100 nm, or h1=110 nm, or h1=130 nm, or h1=150 nm, and the specific thickness of the nucleation layer 121 will not be limited in the embodiment of the present disclosure, as long as it is ensured that the thickness h1 of the nucleation layer 121 satisfies 100 nm ≤ h1 ≤ 150 nm.

On the basis of the embodiment above, continuing referring to FIG. 1, the epitaxial layer 12 provided by the embodiment of the present disclosure may further include a spacer layer 123 located on a side of the buffer layer 122 away from the substrate 11, a barrier layer 124 located on a side of the spacer layer 123 away from a baseboard of the substrate 11, the barrier layer 124 and the buffer layer 122 forming a heterojunction structure, and a capping layer 125 located on a side of the barrier layer 124 away from the substrate 11.

Exemplarily, the spacer layer 123 may be an AlN spacer layer, and the spacer layer 123 may raise the potential barrier, increase the confinement of the two-dimensional electron gas, reduce alloy scattering at the same time, and improve the mobility.

The barrier layer 124 may be an AlGaN barrier layer, and the barrier layer 124 and the buffer layer 122 together form a heterojunction structure forming a movement channel of the two-dimensional electron gas.

The main function of the capping layer 125 is to reduce the surface state, reduce the surface leakage of the subsequent semiconductor device, and suppress the current collapse, thereby improving the performance and reliability of the epitaxial structure as well as the semiconductor device. Optionally, the material of the capping layer 125 is group III nitride, P-type doped gallium nitride (P-GaN). The P-GaN structure can effectively reduce the barrier height of the AlGaN layer.

Figure 2:
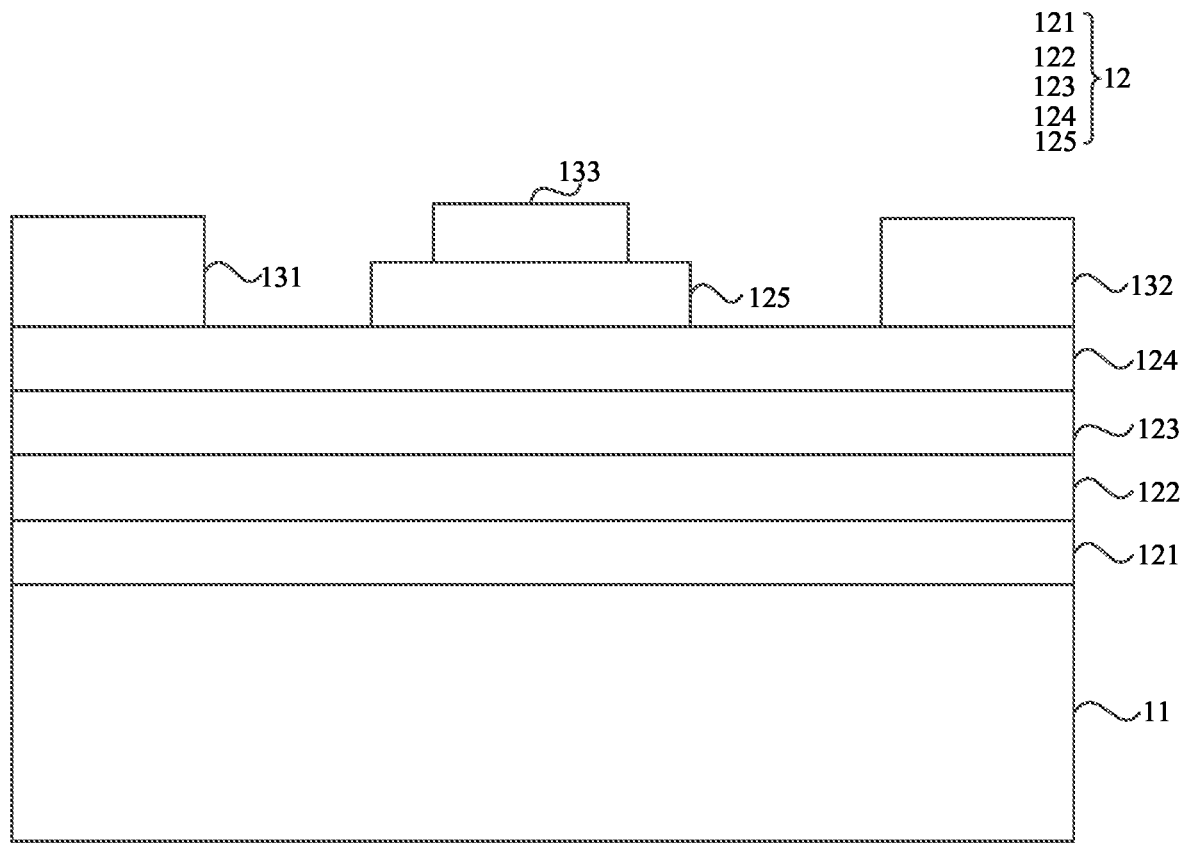
FIG. 2 is a schematic structural diagram of a semiconductor device provided by an embodiment of the present disclosure.

Based on the same inventive concept, an embodiment of the present disclosure further provides a semiconductor device. The semiconductor device provided by the embodiment of the present disclosure includes the epitaxial structure of the semiconductor device described in the embodiment above. Further, FIG. 2 is a schematic structural diagram of a semiconductor device provided by an embodiment of the present disclosure. As shown in FIG. 2, the semiconductor device provided by the embodiment of the present disclosure includes a substrate 11, an epitaxial layer 12 located on a side of the substrate 11, the epitaxial layer 12 including a nucleation layer 121, a buffer layer 122, a spacer layer 123, a barrier layer 124, and a capping layer 125 sequentially located on a side of the substrate 11, a source 131 and a drain 132 located on a side of the barrier layer 124 away from the substrate 11, and a gate 133 located on a side of the capping layer 125 away from the substrate 11, the gate 133 being located between the source 131 and the drain 132.

Exemplarily, the source 131 and the drain 132 are located on a side of the barrier layer 124 away from the substrate 11, and the source 131 and the drain 132 respectively form ohmic contact with the barrier layer 124, the gate 133 is located between the source 131 and the drain 132 and is located on a side of the capping layer 125 away from the substrate 11 at the same time, and the gate 133 and the capping layer 125 form a Schottky contact.

Figure 3:
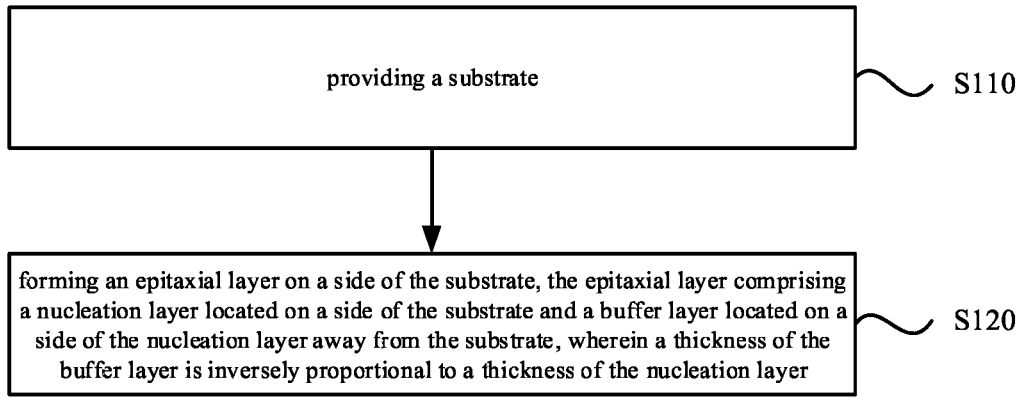
FIG. 3 is a schematic flowchart of a method of manufacturing an epitaxial structure of a semiconductor device provided by an embodiment of the present disclosure.

Based on the same inventive concept, an embodiment of the present disclosure further provides a method of manufacturing an epitaxial structure of a semiconductor device. FIG. 3 is a schematic flowchart of a method of manufacturing an epitaxial structure of a semiconductor device provided by an embodiment of the present disclosure. As shown in FIG. 3, the method of manufacturing an epitaxial structure of a semiconductor device provided by the embodiment of the present disclosure may include:

S110, providing a substrate.

Exemplarily, the material of the substrate may be one or a combination of gallium nitride, aluminum gallium nitride, indium gallium nitride, aluminum indium gallium nitride, indium phosphide, gallium arsenide, silicon carbide, diamond, sapphire, germanium, and silicon, or any other material capable of growing Group III nitrides. The method of forming the substrate may be atmospheric pressure chemical vapor deposition, sub-atmospheric pressure chemical vapor deposition, metal organic compound vapor deposition, low pressure chemical vapor deposition, high density plasma chemical vapor deposition, ultra-high vacuum chemical vapor deposition, plasma-enhanced chemical vapor deposition, catalytic chemical vapor deposition, hybrid physical chemical vapor deposition, rapid thermal chemical vapor deposition, vapor phase epitaxy, pulsed laser deposition, atomic layer epitaxy, molecular beam epitaxy, sputtering, or evaporation.

S120, forming an epitaxial layer on a side of the substrate, the epitaxial layer including a nucleation layer located on a side of the substrate and a buffer layer located on a side of the nucleation layer away from the substrate, wherein a thickness of the buffer layer is inversely proportional to a thickness of the nucleation layer.

The existence of the nucleation layer will increase the overall thermal resistance of the epitaxial layer. However, it is very difficult to obtain good crystal quality for a thin AlN nucleation layer, and simply increasing the thickness of AlN will lead to an increase in thermal resistance and affect device performance. The embodiment of the present disclosure creatively sets the thickness of the nucleation layer in the epitaxial layer to be inversely proportional to the thickness of the buffer layer, so as to improve the crystal quality of the nucleation layer without increasing the thermal resistance, ensuring that the crystal quality, surface morphology and electrical properties of other epitaxial layers located above the nucleation layer are good, and ensuring that the overall quality and reliability of the epitaxial structure as well as the semiconductor device are good.

In conclusion, in the method of manufacturing an epitaxial structure of a semiconductor device provided by the embodiment of the present disclosure, by setting the thickness of the nucleation layer to be inversely proportional to the thickness of the buffer layer, the crystal quality of the nucleation layer is improved without increasing the thermal resistance of the nucleation layer in the epitaxial structure, thereby improving the quality of the epitaxial structure as well as the semiconductor device.

On the basis of the implementation above, forming an epitaxial layer on a side of the substrate may include forming a nucleation layer on a side of the substrate, forming a buffer layer on a side of the nucleation layer away from the substrate, forming a spacer layer on a side of the buffer layer away from the substrate, forming a barrier layer on a side of the spacer layer away from the substrate, the barrier layer and the buffer layer forming a heterojunction structure, and forming a capping layer on a side of the barrier layer away from the substrate.

The potential barrier is raised by the spacer layer, the confinement of the two-dimensional electron gas is increased, the scattering of the alloy is reduced at the same time, and the mobility is improved. The heterojunction structure is formed by the barrier layer and the buffer layer together, and the movement channel of the two-dimensional electron gas is formed. The surface state is reduced by the capping layer, the surface leakage of the subsequent semiconductor device is reduced, and the current collapse is suppressed, thereby improving the performance and reliability of the epitaxial structure as well as the semiconductor device.

Figure 4:
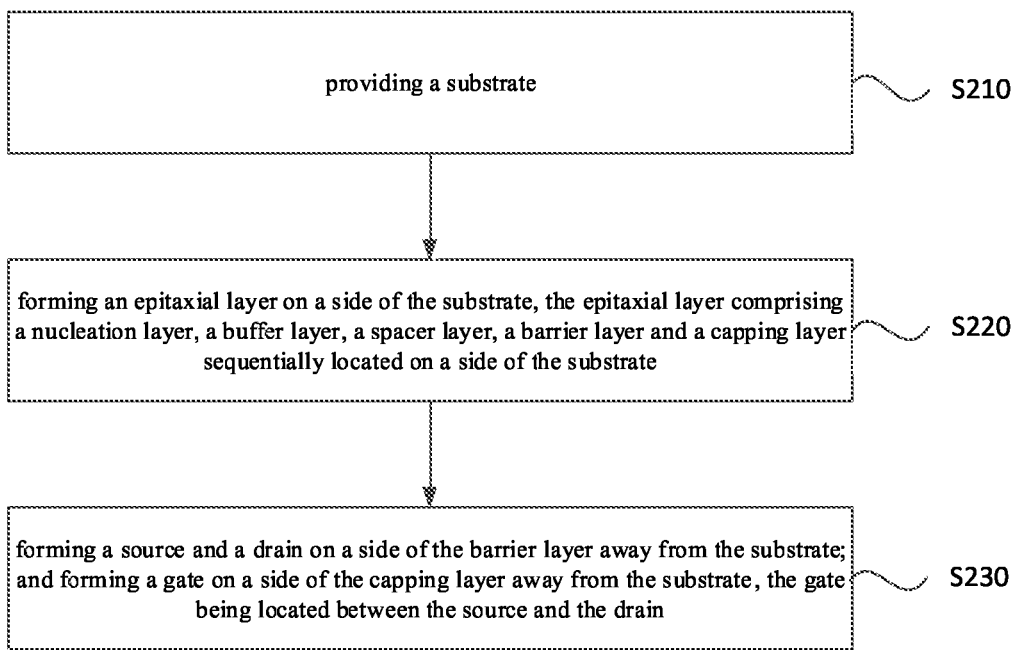
FIG. 4 is a schematic flowchart of a method of manufacturing a semiconductor device provided by an embodiment of the present disclosure.

Based on the same inventive concept, an embodiment of the present disclosure further provides a method of manufacturing a semiconductor device. FIG. 4 is a schematic flowchart of a method of manufacturing a semiconductor device provided by an embodiment of the present disclosure. As shown in FIG. 4, the method of manufacturing a semiconductor device provided by the embodiment of the present disclosure may include:

S210, providing a substrate.

S220, forming an epitaxial layer on a side of the substrate, the epitaxial layer including a nucleation layer, a buffer layer, a spacer layer, a barrier layer, and a capping layer sequentially located on a side of the substrate.

S230, forming a source and a drain on a side of the barrier layer away from the substrate, and forming a gate on a side of the capping layer away from the substrate, the gate being located between the source and the drain.

The source and the drain respectively form ohmic contact with the barrier layer, and the gate, and the capping layer form a Schottky contact.

Figure 5:
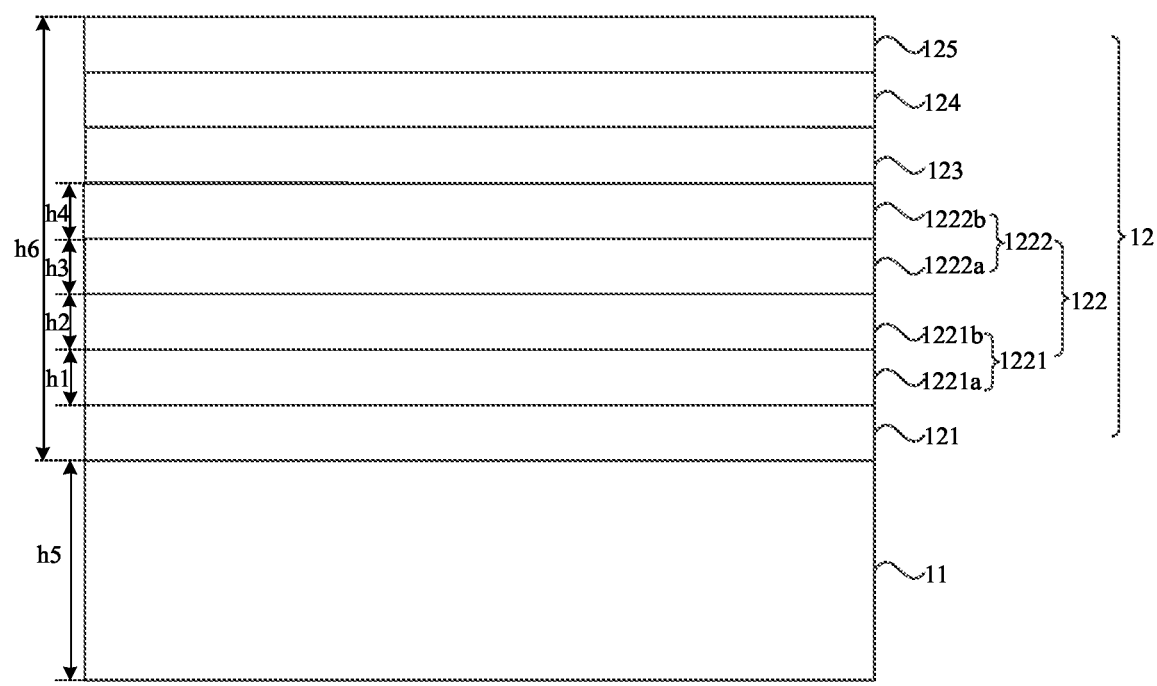
FIG. 5 is a schematic structural diagram of an epitaxial structure of a semiconductor device provided by an embodiment of the present disclosure.

In order to further improve the quality of the epitaxial structure and improve the reliability of the use of the epitaxial structure, the semiconductor epitaxial structure is further optimized. FIG. 5 is a schematic structural diagram of an epitaxial structure of a semiconductor device provided by an embodiment of the present disclosure. As shown in FIG. 5, the epitaxial structure provided by the embodiment of the present disclosure includes a substrate 11, and an epitaxial layer 12 located on a side of the substrate 11, the epitaxial layer 12 including a buffer layer 122 which includes a first-type buffer layer 1221 and a second-type buffer layer 1222 arranged in layers, the first-type buffer layer 1221 is located on a side close to the substrate 11, and the doping concentration of the first-type buffer layer 1221 is greater than the doping concentration of the second-type buffer layer 1222.

The epitaxial layer 12 is located on a side of the substrate 11, and the epitaxial layer 12 may specifically include a semiconductor material based on group III-V compounds.

Specifically, the epitaxial layer 12 includes a buffer layer 122, and the buffer layer 122 plays a role of bonding the semiconductor material layers to be grown next.

The buffer layer 122 includes a first-type buffer layer 1221 and a second-type buffer layer 1222 arranged in layers, the first-type buffer layer 1221 is located on a side close to the substrate 11, the second-type buffer layer 1222 is located on a side away from the substrate 11, and the materials of the first-type buffer layer 1221 and the second-type buffer layer 1222 may be the same, and may be gallium nitride. Further, the thickness and doping of the first-type buffer layer 1221 and the second-type buffer layer 1222 may be different.

Firstly, the doping of the first-type buffer layer 1221 and the second-type buffer layer 1222 will be described.

The C doping concentration required to obtain a high resistance GaN buffer layer needs to satisfy $>1*10^{19}/cm^3$, which will lead to poor crystal quality of the GaN buffer layer, and the Fe doping concentration required to obtain a high resistance GaN buffer layer needs to satisfy $>1*10^{19}/cm^3$, which will affect the performance of the final device. In the embodiment of the present disclosure, the buffer layer 122 is creatively arranged to include a plurality of buffer layers, for example, a first-type buffer layer 1221 and a second-type buffer layer 1222 arranged in layers, the first-type buffer layer 1221 being located on a side close to the substrate 11, and it is set that the doping concentration of the first-type buffer layer 1221 is higher than the doping concentration of the second-type buffer layer 1222 at the same time. A high resistance buffer layer is achieved by the specific doping concentration relationship between the first-type buffer layer 1221 and the second-type buffer layer 1222; for instance, the buffer layer may be set to be lightly doped, so that the reliability of the epitaxial structure as well as the semiconductor device can be improved on the premise that the leakage and breakdown performance of the semiconductor device are not deteriorated.

In conclusion, in the epitaxial structure provided by the embodiment of the present disclosure, by setting the buffer layer to include a first-type buffer layer and a second-type buffer layer arranged in layers, and setting the doping concentration of the first-type buffer layer to be greater than the doping concentration of the second-type buffer layer at the same time, it may ensure good crystal quality of the buffer layer while ensuring the high resistance characteristic of the buffer layer in the epitaxial structure, at the same time, a high resistance buffer layer is achieved through the specific doping concentration relationship between the first-type buffer layer and the second-type buffer layer, for instance, the buffer layer may be set to be lightly doped, so that the reliability of the epitaxial structure as well as the semiconductor device can be improved on the premise that the leakage and breakdown performance of the semiconductor device are not deteriorated.

On the basis of the embodiment above, the first-type buffer layer 1221 may include at least one first buffer layer, and the second-type buffer layer 1222 may include at least one second buffer layer, and the doping concentration of the first buffer layer is greater than the doping concentration of the second buffer layer.

Exemplarily, the first-type buffer layer 1221 may include one or more first buffer layers, and the second-type buffer layer 1222 may include one or more second buffer layers, the doping concentration of each first buffer layer being greater than the doping concentration of the second buffer layer, so as to ensure good crystal quality of the buffer layer while ensuring the high resistance characteristic of the buffer layer, at the same time, the buffer layer may be set to be lightly doped, so that the reliability of the epitaxial structure as well as the semiconductor device can be improved on the premise that the leakage and breakdown performance of the semiconductor device are not deteriorated.

Specifically, the first-type buffer layer 1221 may include two first buffer layers, and the second-type buffer layer 1222 may include two second buffer layers. The embodiment of the present disclosure is described by taking the first-type buffer layer 1221 including two first buffer layers and the second-type buffer layer 1222 including two second buffer layers as an example. Exemplarily, continuing referring to FIG. 5, the first-type buffer layer 1221 includes a first A buffer layer 1221a and a first B buffer layer 1221b arranged in layers, the first A buffer layer 1221a being located on a side close to the substrate 11, the doping concentration of the first A buffer layer 1221a is greater than or equal to the doping concentration of the first B buffer layer 1221b, the second-type buffer layer 1222 includes a second A buffer layer 1222a and a second B buffer layer 1222b arranged in layers, the second A buffer layer 1222a being located on a side close to the substrate 11, and the doping concentration of the second A buffer layer 1222a is greater than the doping concentration of the second B buffer layer 1222b.

Exemplarily, as shown in FIG. 5, the buffer layer 122 may sequentially include a first A buffer layer 1221a, a first B buffer layer 1221b, a second A buffer layer 1222a, and a second B buffer layer 1222b from bottom to top. The doping concentration of any one of the first A buffer layer 1221a and the first B buffer layer 1221b is greater than the doping concentration of any one of the second A buffer layer 1222a and the second B buffer layer 1222b, and the doping concentration of the first A buffer layer 1221a is greater than or equal to that of the first B buffer layer 1221b, and the doping concentration of the second A buffer layer 1222a is greater than the doping concentration of the second B buffer layer 1222b, so that the doping concentration of the buffer layer located in the lower layer is not less than the doping concentration of the buffer layer located in the upper layer in the buffer layer 122. Further, the doping concentrations of the four buffer layers of the first A buffer layer 1221a, the first B buffer layer 1221b, the second A buffer layer 1222a, and the second B buffer layer 1222b in a direction away from the substrate gradually decrease. In this way, a high resistance buffer layer is achieved through the specific doping concentration relationship in the buffer layer, and the specific doping concentration of the buffer layer is not required, ensuring that the reliability of the epitaxial structure as well as the semiconductor device is improved on the premise that the leakage and breakdown of the semiconductor device are not deteriorated.

On the basis of the embodiment above, the first A buffer layer 1221a, the first B buffer layer 1221b, the second A buffer layer 1222a, and the second B buffer layer 1222b may all be doped with carbon ions. The doping concentration of the first A buffer layer 1221a is C1, the doping concentration of the first B buffer layer 1221b is C2, the doping concentration of the second A buffer layer 1222a is C3, and the doping concentration of the second B buffer layer 1222b is C4, where $C1 > C2 \geq C3 > C4$.

Exemplarily, by setting the doping concentration C1 of the first A buffer layer 1221a, the doping concentration C2 of the first B buffer layer 1221b, the doping concentration C3 of the second A buffer layer 1222a, and the doping concentration C4 of the second B buffer layer 1222b to satisfy $C1 > C2 \geq C3 > C4$, it is ensured that the doping concentration of the buffer layer located in the lower layer is not less than the doping concentration of the buffer layer located in the upper layer in the buffer layer 122; by reasonably setting the corresponding doping concentration relationship of the first A buffer layer 1221a, the first B buffer layer 1221b, the second A buffer layer 1222a, and the second B buffer layer 1222b, it can achieve the same effect of the traditional high resistance GaN buffer layer while ensuring that the crystal quality is not deteriorated.

On the basis of the embodiment above, the first A buffer layer 1221a and the first B buffer layer 1221b are further doped with iron ions, while the second A buffer layer 1222a and the second B buffer layer 1222b are not doped with iron ions, the doping concentration of iron ions in the first A buffer layer 1221a is the fifth doping concentration, and the doping concentration of iron ions in the first B buffer layer 1221b is the sixth doping concentration, wherein the fifth doping concentration is the same as the sixth doping concentration.

Exemplarily, the first A buffer layer 1221a and the first B buffer layer 1221b may further be doped with iron ions of the same concentration, while the second A buffer layer 1222a and the second B buffer layer 1222b are not doped with iron ions, by reasonably setting the doping components in respective buffer layers, it is ensured that the same effect of the traditional high resistance GaN buffer layer is achieved while the crystal quality is not deteriorated.

Further, the doping concentration of carbon ions in the first A buffer layer 1221a is the first doping concentration C1, and the fifth doping concentration is C5, where $C1/C5 = (0.5 \sim 1.2)/10$, the doping concentration of carbon ions in the first B buffer layer is the second doping concentration C2, and the sixth doping concentration is C6, where $C2/C6 = (0.1 \sim 0.3)/10$, the doping concentration of carbon ions in the second A buffer layer is the third doping concentration C3, where $C3 = C2$, and the doping concentration of carbon ions in the second B buffer layer is the fourth doping concentration C4, where $C4/C3 = (1 \sim 2)/10$. By reasonably setting the doping ratio of carbon ions and iron ions in the same buffer layer, and setting the doping ratios of carbon ions in different buffer layers at the same time, it is ensured that a high resistance buffer layer may be finally obtained, and the crystal quality of the buffer layer is good, ensuring the good quality and high reliability of the epitaxial structure as well as the semiconductor device.

Further, since the doping concentrations of carbon ions in the first B buffer layer 1221b, the second A buffer layer 1222a, and the second B buffer layer 1222b are directly or indirectly related to the doping concentration of carbon ions in the first A buffer layer 1221a, and the doping concentration of carbon ions in the first A buffer layer 1221a is related to the doping concentration of iron ions in the first A buffer layer 1221a, after the doping concentration of iron ions in the first A buffer layer 1221a changes, the doping concentration of carbon ions in the first A buffer layer 1221a will also be adjusted accordingly, while the doping concentrations of carbon ions in the first B buffer layer 1221b, the second A buffer layer 1222a, and the second B buffer layer 1222b will also be adjusted accordingly. For instance, when the doping concentration of iron ions in the first A buffer layer 1221a is increased to twice of the doping concentration, the doping concentration of carbon ions in the first A buffer layer 1221a will also be adjusted accordingly, while the doping concentrations of carbon ions in the first B buffer layer 1221b, the second A buffer layer 1222a, and the second B buffer layer 1222b will also be adjusted accordingly.

Specifically, the doping concentration C1 of carbon ions and the doping concentration C5 of iron ions in the first A-doped layer 1221a satisfy C1/C5=(0.5~1.2)/10, which may be C1/C5=0.5/10, or C1/C5=0.8/10, or C1/C5=1.0/10, or C1/C5=1.2/10, and the specific doping ratio of the doping concentration C1 of carbon ions and the doping concentration C5 of iron ions in the first A-doped layer 1221a will not be limited in the embodiment of the present disclosure, as long as it satisfies C1/C5=(0.5~1.2)/10. Further, the doping concentration C2 of carbon ions and the doping concentration C6 of iron ions in the first B-doped layer 1221b satisfy C2/C6=(0.1~0.3)/10, which may be C2/C6=0.1/10, or C2/C6=0.2/10, or C2/C6=0.3/10, and the specific doping ratio of the doping concentration C2 of carbon ions to the doping concentration C6 of iron ions in the first B-doped layer 1221b will not be limited in the embodiment of the present disclosure, as long as it satisfies C2/C6=(0.1~0.3)/10. Further, the doping concentration C4 of carbon ions in the second B-doped layer 1222b and the doping concentration C3 of carbon ions in the second A-doped layer 1222a satisfy C4/C3=(1~2)/10, which may be C4/C3=1/10, or C4/C3=1.5/10, or C4/C3=2/10, and the specific doping ratio of the doping concentration C4 of carbon ions in the second B-doped layer 1222b to the doping concentration C3 of carbon ions in the second A-doped layer 1222a will not be limited in the embodiment of the present disclosure, as long as it satisfies C4/C3=(1~2)/10.

Further, the doping concentration C5 of iron ions in the first A buffer layer 1221a may satisfy C5=1*10^{18}/cm^3~1*10^{19}/cm^3, and the doping concentration C6 of iron ions in the first B buffer layer 1221b may satisfy C6=1*10^{18}/cm^3~1*10^9/cm^3, the doping concentration of iron ions in the first A buffer layer 1221a and the doping concentration of iron ions in the first B buffer layer 1221b are both lightly doped, which will not affect the crystal quality of each buffer layer, and can ensure stable performance of the epitaxial structure as well as the semiconductor device. As a feasible implementation, the doping concentration C1 of carbon ions in the first A buffer layer 1221a may be $2*10^{17}/cm^3$, and the doping concentration C5 of iron ions in the first A buffer layer 1221a may be $2*10^{18}/cm^3$, the doping concentration C2 of carbon ions in the first B buffer layer 1221b may be $5*10^{16}/cm^3$, and the doping concentration C6 of iron ions in the first B buffer layer 1221b may be $2*10^{18}/cm^3$, the doping concentration C3 of carbon ions in the second A buffer layer 1222a may be $5*10^{16}/cm^3$, and the doping concentration of iron ions in the second A buffer layer 1222a is 0, and the doping concentration C4 of carbon ions in the second B buffer layer 1222b may be $2.5*10^{16}/cm^3$, and the doping concentration of iron ions in the second B buffer layer 1222b is 0.

The embodiment above describes the doping in each buffer layer, by reasonably setting the doping concentration in each buffer layer, it may ensure good crystal quality of the buffer layer while ensuring the high resistance characteristic of the buffer layer in the epitaxial structure, so that the reliability of the epitaxial structure as well as the semiconductor device can be improved on the premise that the leakage and breakdown performance of the semiconductor device are not deteriorated.

Next, the thickness of the first-type buffer layer 1221 and the second-type buffer layer 1222 will be described.

Optionally, the thickness of the first buffer layer is greater than the thickness of the second buffer layer.

Exemplarily, the first-type buffer layer 1221 may include one or more first buffer layers, and the second-type buffer layer 1222 may include one or more second buffer layers. The thickness of each first buffer layer is greater than the thickness of the second buffer layer, ensuring good crystal quality of the buffer layer while ensuring the high resistance characteristic of the buffer layer, at the same time, the buffer layer may be lightly doped, so that the reliability of the epitaxial structure as well as the semiconductor device can be improved on the premise that the leakage and breakdown performance of the semiconductor device are not deteriorated.

Specifically, the first-type buffer layer 1221 may include two first buffer layers, and the second-type buffer layer 1222 may include two second buffer layers. The embodiment of the present disclosure is described by taking the first-type buffer layer 1221 including two first buffer layers and the second-type buffer layer 1222 including two second buffer layers as an example. Exemplarily, continuing referring to FIG. 5, the first-type buffer layer 1221 includes a first A buffer layer 1221a and a first B buffer layer 1221b arranged in layers, the first A buffer layer 1221a being located on a side close to the substrate 11, the thickness of the first A buffer layer 1221a is greater than or equal to the thickness of the first B buffer layer 1221b, the second-type buffer layer 1222 includes a second A buffer layer 1222a and a second B buffer layer 1222b arranged in layers, the second A buffer layer 1222a being located on a side close to the substrate 11, and the thickness of the second A buffer layer 1222a is greater than that of the second B buffer layer 1222b.

Exemplarily, as shown in FIG. 5, the buffer layer 122 may sequentially include a first A buffer layer 1221a, a first B buffer layer 1221b, a second A buffer layer 1222a, and a second B buffer layer 1222b from bottom to top. The thickness of any one of the first A buffer layer 1221a and the first B buffer layer 1221b is greater than the thickness of any one of the second A buffer layer 1222a and the second B buffer layer 1222b, the thickness of the first A buffer layer 1221a is greater than or equal to the thickness of the first B buffer layer 1221b, and the thickness of the second A buffer layer 1222a is greater than the thickness of the second B buffer layer 1222b, so that the thickness of the buffer layer located in the lower layer is not smaller than the thickness of the buffer layer located in the upper layer in the buffer layer 122. For instance, based on the thickness h1 of the first-type A buffer layer close to the substrate, the thickness of each buffer layer gradually decreases in the direction away from the substrate. That is, the thickness h1 of the first-type A buffer layer is a preset thickness, and the thickness h of the other buffer layers is determined according to the thickness relationship of h1, where h≤h1. In this way, the high resistance buffer layer is achieved through a specific thickness relationship in the buffer layer, and the doping concentration of the buffer layer is not required, so that the reliability of the epitaxial structure as well as the semiconductor device is improved on the premise that the leakage and breakdown performance of the semiconductor device are not deteriorated.

On the basis of the embodiment above, the thickness of the first A buffer layer 1221a is h1, the thickness of the first B buffer layer 1221b is h2, the thickness of the second A buffer layer 1222a is h3, and the thickness of the second B buffer layer 1222b is h4, where h2=h1, 2/10≤h3/h2≤9/10, 4/10≤h4/h3≤9/10.

Exemplarily, by setting the thickness h1 of the first A buffer layer 1221a, the thickness h2 of the first B buffer layer 1221b, the thickness h3 of the second A buffer layer 1222a, and the thickness h4 of the second B buffer layer 1222b satisfy h2=h1, 2/10≤h3/h2≤9/10, 4/10≤h4/h3≤9/10, by reasonably setting the corresponding thickness ratios among the first A buffer layer 1221a, the first B buffer layer 1221b, the second A buffer layer 1222a, and the second B buffer layer 1222b, it can achieve the same effect of the traditional high resistance GaN buffer layer while ensuring that the crystal quality is not deteriorated.

Specifically, the thickness h2 of the first B buffer layer 1221b and the thickness h3 of the second A buffer layer 1222a satisfy 2/10≤h3/h2≤9/10, where it may be h3/h2=2/10, or h3/h2=4/10, or h3/h2=6/10, or h3/h2=8/10, or h3/h2=9/10, and the specific proportional relationship between the thickness h2 of the first B buffer layer 1221b and the thickness h3 of the second A buffer layer 1222a will not be limited in the embodiment of the present disclosure, as long as it satisfies 2/10≤h3/h2≤9/10. Further, the thickness h3 of the second A buffer layer 1222a and the thickness h4 of the second B buffer layer 1222b satisfy 4/10≤h4/h3≤9/10, where it may be h4/h3=4/10, or h4/h3=6/10, or h4/h3=8/10, or h4/h3=9/10, and the specific proportional relationship between the thickness h3 of the second A buffer layer 1222a and the thickness h4 of the second B buffer layer 1222b will not be limited in the embodiment of the present disclosure, as long as it satisfies 4/10≤h4/h3≤9/10. As a feasible implementation, the thickness h1 of the first A buffer layer 1221a may be 500 nm, the thickness h2 of the first B buffer layer 1221b may be 500 nm, the thickness h3 of the second A buffer layer 1222a may be 400 nm, and the thickness h4 of the second B buffer layer 1222b may be 300 nm.

The embodiment above describes the thickness of each buffer layer. By reasonably setting the thickness of each buffer layer, it may ensure good crystal quality of the buffer layer while ensuring the high resistance characteristic of the buffer layer in the epitaxial structure, so that the reliability of the epitaxial structure as well as the semiconductor device can be improved on the premise that the leakage and breakdown performance of the semiconductor device are not deteriorated.

In conclusion, the embodiment above has respectively described the specific arrangement of the epitaxial layer from the two aspects of the doping concentration and thickness of the different buffer layers. It can be appreciated that in the actual epitaxial layer setting, the doping concentration and thickness of different buffer layers can be comprehensively considered; for instance, as for a buffer layer with a greater thickness, its doping concentration may be set to be higher, and as for a buffer layer with a smaller thickness, its doping concentration may be set to be lower. By comprehensively considering the doping concentration and thickness of different buffer layers, it may ensure good crystal quality of the buffer layer while ensuring the high resistance characteristic of the buffer layer in the epitaxial structure, so that the reliability of the epitaxial structure as well as the semiconductor device can be improved on the premise that the leakage and breakdown performance of the semiconductor device are not deteriorated.

On the basis of the embodiment above, continuing referring to FIG. 5, the epitaxial layer 12 provided by the embodiment of the present disclosure may further include a nucleation layer 121 located on a side of the buffer layer 122 close to the substrate 11, a spacer layer 123 located on a side of the buffer layer 122 away from the substrate 11, a barrier layer 124 located on a side of the spacer layer 123 away from a baseboard of the substrate 11, the barrier layer 124 and the buffer layer 122 forming a heterojunction structure, and a capping layer 125 on a side of the barrier layer 124 away from the substrate 11.

Exemplarily, the nucleation layer 121 affects parameters such as crystal quality, surface morphology, and electrical properties of other film layers located above the nucleation layer 121 in the epitaxial layer 12, and the nucleation layer 121 mainly plays a role of matching the material of the substrate 11 and the semiconductor material layer in the heterojunction structure in the epitaxial layer 12.

The spacer layer 123 may be an AlN spacer layer, and the spacer layer 123 may raise the potential barrier, increase the confinement of the two-dimensional electron gas, reduce alloy scattering at the same time, and improve the mobility.

The barrier layer 124 may be an AlGaN barrier layer, and the barrier layer 124 and the buffer layer 122 together form a heterojunction structure to form a movement channel of the two-dimensional electron gas.

The main function of the capping layer 125 is to reduce the surface state, reduce the surface leakage of the subsequent semiconductor device, and suppress the current collapse, thereby improving the performance and reliability of the epitaxial structure as well as the semiconductor device. Optionally, the material of the capping layer 125 is group III nitride, P-type doped gallium nitride (P-GaN). The P-GaN structure can effectively reduce the barrier height of the AlGaN layer.

Figure 6:
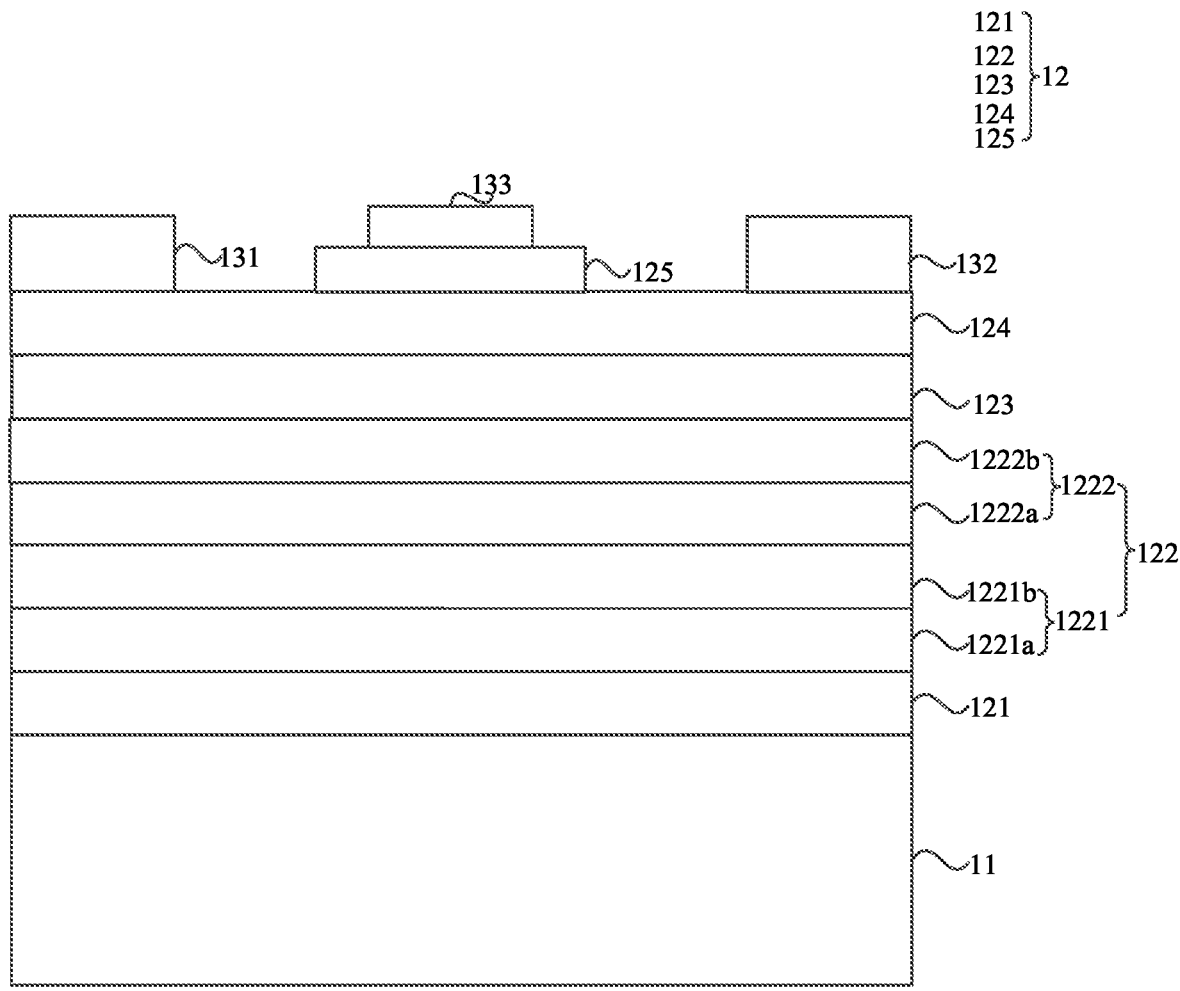
FIG. 6 is a schematic structural diagram of a semiconductor device provided by an embodiment of the present disclosure.

Based on the same inventive concept, an embodiment of the present disclosure further provides a semiconductor device. The semiconductor device provided by the embodiment of the present disclosure includes the epitaxial structure of the semiconductor device described in the embodiment above. Further, FIG. 6 is a schematic structural diagram of a semiconductor device provided by an embodiment of the present disclosure. As shown in FIG. 6, the semiconductor device provided by the embodiment of the present disclosure includes a substrate 11, an epitaxial layer 12 located on a side of the substrate 11, the epitaxial layer 12 including a nucleation layer 121, a buffer layer 122, a spacer layer 123, a barrier layer 124, and a capping layer 125 sequentially located on a side of the substrate 11, a source 131 and a drain 132 located on a side of the barrier layer 124 away from the substrate 11, and a gate 133 located on a side of the capping layer 125 away from the substrate 11, the gate 133 being located between the source 131 and the drain 132.

Exemplarily, the source 131 and the drain 132 are located on a side of the barrier layer 124 away from the substrate 11, and the source 131 and the drain 132 respectively form ohmic contact with the barrier layer 124, the gate 133 is located between the source 131 and the drain 132 and is located on a side of the capping layer 125 away from the substrate 11 at the same time, and the gate 133 and the capping layer 125 form a Schottky contact.

It should be appreciated that the embodiment of the present disclosure improves the crystal quality of the nucleation layer without increasing the thermal resistance of the nucleation layer in the semiconductor device from the perspective of the structural design of the semiconductor device. The semiconductor device includes but is not limited to high-power gallium nitride High Electron Mobility Transistor (referred to as HEMT) working in high voltage and high current environment, transistor of a structure of Silicon-On-Insulator (referred to as SOI), gallium arsenide (GaAs)-based transistor and Metal-Oxide-Semiconductor Field-Effect Transistor (referred to as MOSFET), Metal-Semiconductor Field-Effect Transistor (referred to as MISFET), Double Heterojunction Field-Effect Transistor (referred to as DHFET), Junction Field-Effect Transistor (referred to as JFET), Metal-Semiconductor Field-Effect Transistor (referred to as MESFET), Metal-Insulator Heterojunction Field-Effect Transistor (referred to as MISHFET) or other field-effect transistors.

Figure 7:
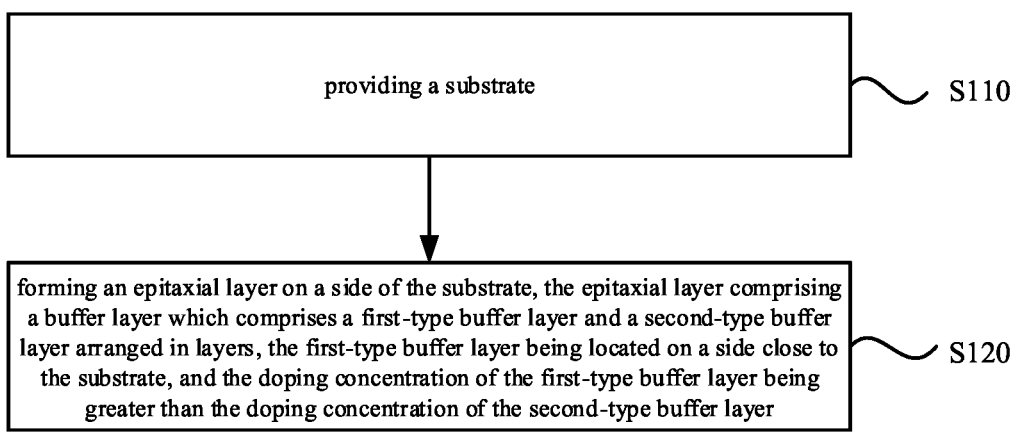
FIG. 7 is a schematic flowchart of a method of manufacturing an epitaxial structure of a semiconductor device provided by an embodiment of the present disclosure.

Based on the same inventive concept, an embodiment of the present disclosure further provides a method of manufacturing an epitaxial structure of a semiconductor device. FIG. 7 is a schematic flowchart of a method of manufacturing an epitaxial structure of a semiconductor device provided by an embodiment of the present disclosure. As shown in FIG. 7, the method of manufacturing an epitaxial structure of a semiconductor device provided by the embodiment of the present disclosure may include:

S110, providing a substrate.

S120, forming an epitaxial layer on a side of the substrate, the epitaxial layer including a buffer layer which includes a first-type buffer layer and a second-type buffer layer arranged in layers, the first-type buffer layer being located on a side close to the substrate, and the doping concentration of the first-type buffer layer being greater than the doping concentration of the second-type buffer layer.

The C doping concentration required to obtain a high resistance GaN buffer layer needs to satisfy $>1*10^{19}/cm^3$, which will lead to poor crystal quality of the GaN buffer layer, and the Fe doping concentration required to obtain a high resistance GaN buffer layer needs to satisfy $>1*10^{19}/cm^3$, which will affect the performance of the final device. In the embodiment of the present disclosure, the buffer layer 122 is creatively arranged to include a plurality of buffer layers, for example, a first-type buffer layer 1221 and a second-type buffer layer 1222 arranged in layers, the first-type buffer layer 1221 being located on a side close to the substrate 11, and it is set that the doping concentration of the first-type buffer layer 1221 is higher than the doping concentration of the second-type buffer layer 1222 at the same time, a high resistance buffer layer is achieved by the specific doping concentration relationship between the first-type buffer layer 1221 and the second-type buffer layer 1222, and the specific doping concentration of the buffer layer is not required; for instance, the buffer layer may be set to be lightly doped, so that the reliability of the epitaxial structure as well as the semiconductor device can be improved on the premise that the leakage and breakdown performance of the semiconductor device are not deteriorated.

In conclusion, in the method of manufacturing an epitaxial structure of a semiconductor device provided by the embodiment of the present disclosure, by setting the buffer layer to include a first-type buffer layer and a second-type buffer layer arranged in layers, and setting the doping concentration of the first-type buffer layer to be greater than the doping concentration of the second-type buffer layer at the same time, it may ensure good crystal quality of the buffer layer while ensuring the high resistance characteristic of the buffer layer in the semiconductor device; at the same time, a high resistance buffer layer is achieved through the specific doping concentration relationship between the first-type buffer layer and the second-type buffer layer, for instance, the buffer layer may be set to be lightly doped, so that the reliability of the epitaxial structure as well as the semiconductor device can be improved on the premise that the leakage and breakdown performance of the semiconductor device are not deteriorated.

On the basis of the embodiment above, forming an epitaxial layer on a side of the substrate may include forming a nucleation layer on a side of the substrate, forming a buffer layer on a side of the nucleation layer away from the substrate, forming a spacer layer on a side of the buffer layer away from the substrate, forming a barrier layer on a side of the spacer layer away from the substrate, the barrier layer and the buffer layer forming a heterojunction structure, and forming a capping layer on a side of the barrier layer away from the substrate.

The nucleation layer matches the substrate material and the semiconductor material layer in the heterojunction structure in the epitaxial layer, the spacer layer raises the potential barrier, increases the confinement of the two-dimensional electron gas, reduces alloy scattering at the same time, and improves the mobility. The barrier layer and the buffer layer form a heterojunction structure together to form the movement channel of the two-dimensional electron gas, and the capping layer reduces the surface state, reduces the surface leakage of the subsequent semiconductor device, and suppresses the current collapse, thereby improving the performance and reliability of the epitaxial structure as well as the semiconductor device.

Figure 8:
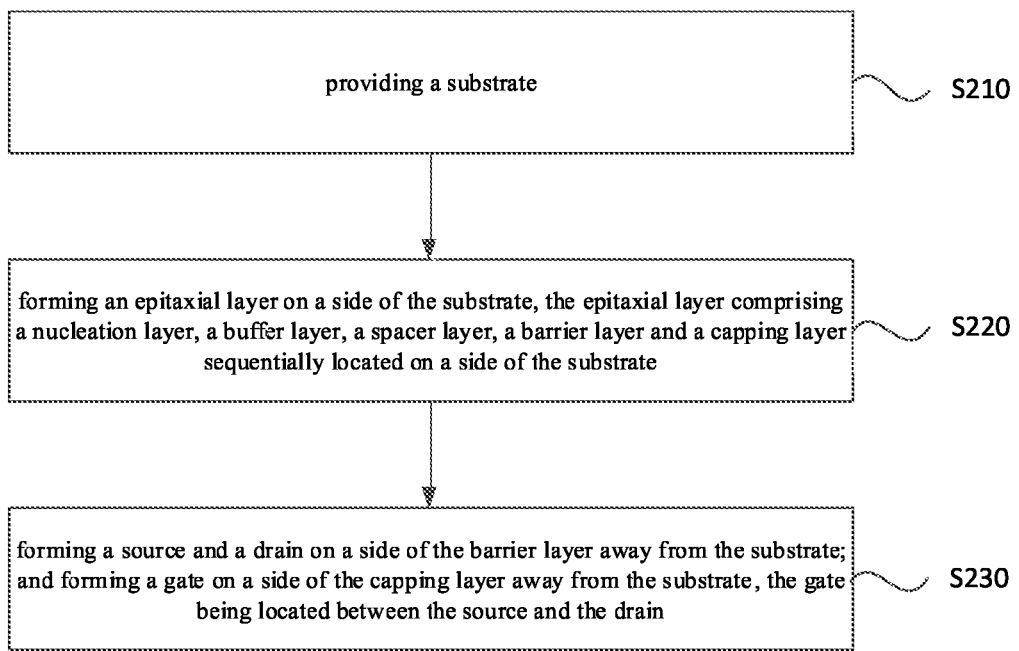
FIG. 8 is a schematic flowchart of a method of manufacturing a semiconductor device provided by an embodiment of the present disclosure.

Based on the same inventive concept, an embodiment of the present disclosure further provides a method of manufacturing a semiconductor device. FIG. 8 is a schematic flowchart of a method of manufacturing a semiconductor device provided by an embodiment of the present disclosure. As shown in FIG. 8, the method of manufacturing a semiconductor device provided by the embodiment of the present disclosure may include:

S210, providing a substrate.

S220, forming an epitaxial layer on a side of the substrate, the epitaxial layer including a nucleation layer, a buffer layer, a spacer layer, a barrier layer, and a capping layer sequentially located on a side of the substrate.

S230, forming a source and a drain on a side of the barrier layer away from the substrate, and forming a gate on a side of the capping layer away from the substrate, the gate being located between the source and the drain.

The source and the drain respectively form ohmic contact with the barrier layer, and the gate and the capping layer form a Schottky contact.

It should be noted that the above are only example embodiments and applied technical principles of the present disclosure. Those skilled in the art should understand that the present disclosure is not limited to the specific embodiments described herein, and for those skilled in the art, various obvious changes, rearrangements, combinations, and substitutions can be made without departing from the protection scope of the present disclosure. Therefore, although the present disclosure has been described in detail through the embodiments above, the present disclosure is not limited to the embodiments above. The present disclosure may also include other equivalent embodiments without departing from the spirit of the present disclosure, and the scope of the present disclosure should be defined by the scope of the appended claims.

What is claimed is:

1. An epitaxial structure of a semiconductor device, the structure comprising:
   a substrate; and
   an epitaxial layer located on a side of the substrate, the epitaxial layer comprising a nucleation layer located on a side of the substrate and a buffer layer locate on a side of the nucleation layer opposite the substrate,
   wherein a thickness of the buffer layer is inversely proportional to a thickness of the nucleation layer,
   wherein the thickness of the nucleation layer is h1 and the thickness of the buffer layer is h2,
   wherein $0.1/h2 \leq h1 \leq 0.25/h2$,
   wherein the buffer layer comprises a first-type buffer layer and a second-type buffer layer arranged in layers, wherein the first-type buffer layer is located on a side close to the substrate, and wherein a doping concentration of the first-type buffer layer is greater than a doping concentration of the second-type buffer layer,
   wherein the first-type buffer layer comprises a first A buffer layer and a first B buffer layer arranged in layers, wherein the first A buffer layer is located on a side close to the substrate, and wherein a doping concentration of the first A buffer layer is greater than or equal to the doping concentration of the first B buffer layer,
   wherein the second-type buffer layer comprises a second A buffer layer and a second B buffer layer arranged in layers, wherein the second A buffer layer is located on a side close to the substrate, and wherein a doping concentration of the second A buffer layer is greater than a doping concentration of the second B buffer layer,
   wherein the first A buffer layer, the first B buffer layer, the second A buffer layer, and the second B buffer layer are all doped with carbon ions,
   wherein a doping concentration of the carbon ions in the first A buffer layer is a first doping concentration C1, wherein a doping concentration of the carbon ions in the first B buffer layer is a second doping concentration C2, wherein a doping concentration of the carbon ions in the second A buffer layer is a third doping concentration C3, wherein a doping concentration of the carbon ions in the second B buffer layer is a fourth doping concentration C4, and wherein C1>C2=C3>C4,
   wherein the first A buffer layer and the first B buffer layer are further doped with iron ions, while the second A buffer layer and the second B buffer layer are not doped with iron ions,
   a doping concentration of the iron ions in the first A buffer layer is a fifth doping concentration C5, a doping concentration of the iron ions in the first B buffer layer is a sixth doping concentration C6, and wherein the fifth doping concentration is the same as the sixth doping concentration,
   wherein C1/C5=(0.5~1.2)/10,
   wherein C2/C6=(0.1~0.3)/10, and
   wherein C4/C3=(1~2)/10.

2. The epitaxial structure according to claim 1, wherein $h1=0.17/h2$.

3. The epitaxial structure according to claim 1, wherein the thickness of the nucleation layer is h1, wherein a thickness of the substrate is h3, and
   wherein $2*10^{-5} \leq h1/h3 \leq 5*10^{-4}$.

4. The epitaxial structure according to claim 1, wherein the thickness of the nucleation layer is h1, wherein a thickness of the epitaxial layer is h4, and
   wherein $0.05 \leq h1/h4 \leq 0.3$.

5. The epitaxial structure according to claim 4, wherein $0.07 \leq h1/h4 \leq 0.1$.

6. The epitaxial structure according to claim 1,
   wherein the thickness of the nucleation layer is h1, and
   wherein 100 nm $\leq h1 \leq$ 150 nm.

7. The epitaxial structure according to claim 1, wherein a thickness of the first-type buffer layer is greater than a thickness of the second-type buffer layer.

8. The epitaxial structure according to claim 7, wherein thickness of the first A buffer layer is greater than or equal to a thickness of the first B buffer layer; and
   wherein a thickness of the second A buffer layer is greater than a thickness of the first B buffer layer.

9. A method of manufacturing the epitaxial structure according to claim 1 for the semiconductor device, the method comprising:
   providing the substate;
   forming the nucleation layer on the side of the substrate;
   the buffer layer on the side of the nucleation layer opposite the substrate,
   forming a spacer layer on a side of the buffer opposite the substrate;
   forming a barrier layer on a side of the spacer layer opposite the substrate, the barrier layer and the buffer layer forming a heterojunction structure; and
   forming a capping layer on a side of the barrier layer opposite the substrate.

\* \* \* \* \*